United States Patent [19]
Shi

[11] Patent Number: 5,926,049
[45] Date of Patent: Jul. 20, 1999

[54] LOW POWER CMOS LINE DRIVER WITH DYNAMIC BIASING

[75] Inventor: Xudong Shi, Irvine, Calif.

[73] Assignee: Level One Communications, Inc., Sacramento, Calif.

[21] Appl. No.: 08/840,187

[22] Filed: Apr. 11, 1997

[51] Int. Cl.⁶ .................................................. H03K 3/09
[52] U.S. Cl. ........................ 327/170; 327/108; 327/112; 326/82; 326/86
[58] Field of Search ..................................... 327/108, 110, 327/112, 170, 175, 53, 66, 172; 326/82, 86, 90

[56] References Cited

U.S. PATENT DOCUMENTS

| | | | |
|---|---|---|---|
| 5,410,262 | 4/1995 | Kang ........................................ | 327/170 |
| 5,471,171 | 11/1995 | Itakura et al. ........................... | 330/253 |
| 5,512,859 | 4/1996 | Moraveji ................................. | 330/267 |
| 5,729,178 | 3/1998 | Park et al. .............................. | 330/258 |
| 5,739,715 | 4/1998 | Rawson ................................... | 327/108 |

*Primary Examiner*—Timothy P. Callahan
*Assistant Examiner*—Jung Ho Kim
*Attorney, Agent, or Firm*—Merchant, Gould, Smith, Edell, Welter & Schmidt, P.A.

[57] ABSTRACT

A low power line driver uses a dynamic biasing scheme together with single ended architecture to achieve low power, fast speed and high return loss. The line driver includes a first and second operation amplifier each having an output port for generating an output pulse signal having a rising and falling edge. The load is coupled to the first and second output port by a transformer. A first and second digital control circuit is coupled to the first and second operational amplifiers to control the operational amplifiers. The first and second operational amplifiers further include a pulse circuit for generating the output pulse signal and a selectable current source having a first mode for injecting a high current to the pulse circuit to provide a high slew rate for the rising edge of the output pulse signal and a second mode for injecting a second current to the pulse circuit during the generation of the remaining portion of the output pulse signal. An output impedance control element is provided for providing a low output impedance during a second phase. A digital control circuit is provided for providing control signals to the pulse circuit and the selectable current source for controlling the timing and generation of the output pulse signal. Finally, a processes compensation circuit is provided for reducing dynamic current amplitude variation for the circuit elements.

35 Claims, 4 Drawing Sheets

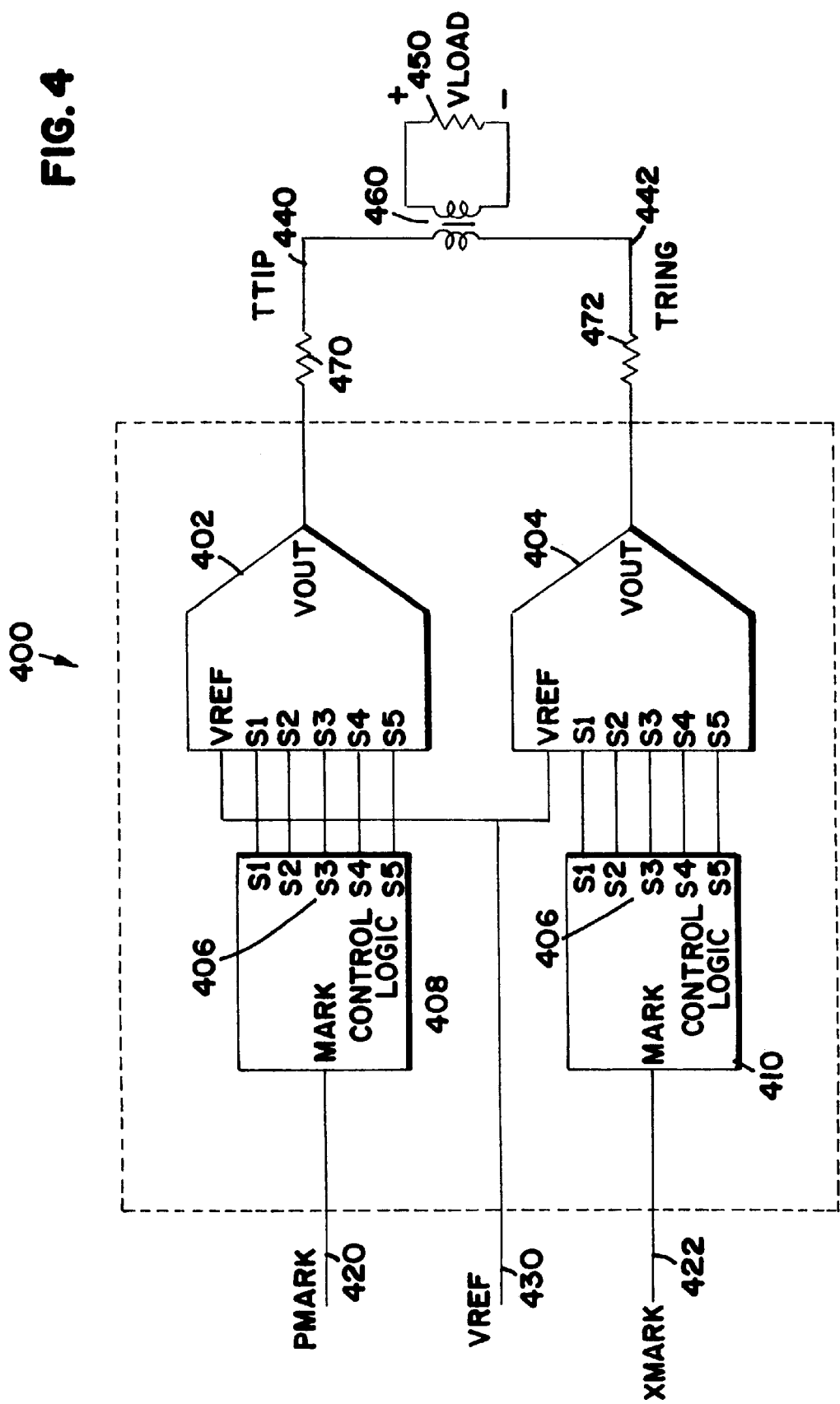

LOW POWER CMOS LINE DRIVER WITH DYNAMIC BIASING

BACKGROUND OF THE INVENTION

1. Field of the Invention

This invention relates in general to line interface devices, and more particularly to a low power CMOS line driver having dynamic biasing capabilities.

2. Description of Related Art

Digital systems typically include several Very Large Scale Integrated (VLSI) circuits that cooperate and communicate with one-another to perform a desired task. Data transceivers are used to interface the VLSI circuits to the transmission medium.

A data transceiver is a read/write terminal capable of transmitting information to and receiving information from the transmission medium. A transceiver typically includes a line driver stage (or simply "driver") and a receiver stage (or simply "receiver"). The common purpose of transmission line drivers and receivers is to transmit data quickly and reliably through a variety of environments over electrically long distances. This task is complicated by the fact that externally introduced noise and ground shifts can severely degrade the data.

Drivers may amplify digital signal outputs from the VLSI circuitry so that the signals can be properly transmitted on the transmission medium. Receivers are typically differential amplifiers that receive signals from the transmission medium and provide outputs to the VLSI circuitry that are representative of digital information received from the medium.

Conventional drivers usually include level shifting capability to provide compatibility with different integrated circuit technologies. Specifically, before a driver transmits a signal across a transmission medium, the driver may change the nominal voltage swing (or the "dynamic signal range") utilized by the VLSI circuitry, e.g., CMOS, TTL, ECL, etc., to a different voltage swing that is utilized by the transmission medium. Thus, a driver may amplify a digital signal, as well as changes the nominal voltage swing of the signal as well.

CMOS technology is attractive for implementing VLSI circuits with high density and with much lower power dissipation than its bipolar counterpart. However, standard TTL or CMOS circuits operate between 5 Volts and ground which causes them to dissipate excessive amounts of power when driving terminated transmission lines. ECL has been used for many years to drive terminated transmission lines; however, ECL has relatively high power dissipation.

A different nominal voltage swing is normally used when transmitting data across a transmission medium in order to conserve power. Specifically, the power internally dissipated by the driver is proportional to the nominal voltage swing of the binary signal it applies to the transmission line. Therefore, power dissipation is reduced if the driver transmits a signal having a relatively small voltage swing over the transmission line.

Low power CMOS line drivers are needed to meet the low power, high speed and high return loss requirements for quad E1(2.048 MHz) and E2(8.448 MHz) transceivers. Fast transition edges of E1/E2 pulses require a line driver to have a high slew rate. Further, to get a high return loss, the line driver's output must exhibit low impedance.

It can be seen that there is a need for a CMOS line driver that can provide the high slew rate required for initial pulse edges with low power consumption.

It can also be seen that there is a need for a low power CMOS line driver with a high slew rate and a low output impedance.

SUMMARY OF THE INVENTION

To overcome the limitations in the prior art described above, and to overcome other limitations that will become apparent upon reading and understanding the present specification, the present invention discloses a low power CMOS line driver.

The present invention solves the above-described problems by providing a low power line driver that uses a dynamic biasing scheme together with single ended architecture to achieve low power, fast speed and high return loss.

A system in accordance with the principles of the present invention includes a first operation amplifier having a first output port and a second operational amplifier having a second output port for generating at the first and second output port an output pulse signal having a rising and falling edge for driving a load on a transmission line in response to an input reference signal. The load is coupled to the first and second output port by a transformer. A first and second digital control circuit is coupled to the first and second operational amplifiers for providing control signals to the operational amplifiers to control timing of the output pulse signal. The first and second operational amplifiers further include a pulse circuit for receiving the input reference signal and generating the output pulse signal and a selectable current source having a first mode for injecting a first current to the pulse circuit to provide a high slew rate for the rising edge of the output pulse signal and a second mode for injecting a second current to the pulse circuit during the generation of the output pulse signal. The first current is greater than the second current.

One aspect of the present invention is that the selectable current source includes a first current source for injecting a base current to the pulse circuit and a second current source for injecting a supplemental current to the pulse circuit, wherein the first current comprises the base current and the supplemental current and the second current comprises the base current.

Another aspect of the present invention is that a tail current selection circuit is provided for controlling the timing for the injection of the first current.

Another aspect of the present invention is that the output pulse signal is generated during a first phase and the pulse circuit further includes an output impedance control element for providing a low output impedance for the pulse circuit during a second phase.

Another aspect of the present invention is that the pulse circuit does not generate an output pulse signal during the second phase.

Still another aspect of the present invention is that the pulse circuit further includes a differential input pair and the output impedance control element includes a current switch pair, wherein the differential input pair receives an input signal and drives the load in response thereto during the first phase and the current switch pair pulls the output to ground level on the falling edge of the output pulse to create a low output impedance.

Another aspect of the present invention is that the pulse circuit includes a differential input pair for receiving an input signal and driving the load in response thereto during the first phase.

Another aspect of the present invention is that a resistor is disposed between the output impedance control element and the load to provide high return loss during the second phase.

Another aspect of the present invention is that a digital control circuit is provided for providing control signals to the pulse circuit and the selectable current source for controlling the timing and generation of the output pulse signal.

Another aspect of the present invention is that the selectable current source injects the second current to the pulse circuit during the first phase to maintain bandwidth for high slew rate during the generation of the output pulse signal.

Yet another aspect of the present invention is that the pulse circuit and the selectable current source are designed with CMOS transistors.

Another aspect of the present invention is that a processes compensation circuit is provided for reducing dynamic current amplitude variation for the CMOS transistors.

Another aspect of the present invention is that the pulse circuit transitions to a sleep mode during the second phase thereby providing low power consumption.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 4 illustrates a block diagram of the overall CMOS line driver circuit; and

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a low power CMOS line driver having dynamic biasing capabilities.

Amplifier slew rate is proportional to the current being fed to a circuit, which translates into the power being consumed by the circuit. For pulse signal, like E1/E2 pulses, the transition edges require high slew rate. Nevertheless, the space phase and flat top of the pulse does not need such high slew rate. Accordingly, a CMOS line driver according to the present invention may compress the power to the transition edge of the rising edge to reduce the power consumption. This dynamic biasing achieves both high speed operation and low power consumption.

To achieve a high return loss, the CMOS line driver provides low output impedance. In feedback amplifiers, a high gain-bandwidth is necessary to obtain low output impedance. The low power CMOS line driver according to the present invention incorporates single end architecture to achieve low output impedance and low power during space phase and a feedback amplifier configuration is used during mark phase. Accordingly, for similar low power consumption environments, the overall driver output impedance will be lower than the output impedance of the differential line driver.

Figure 1:
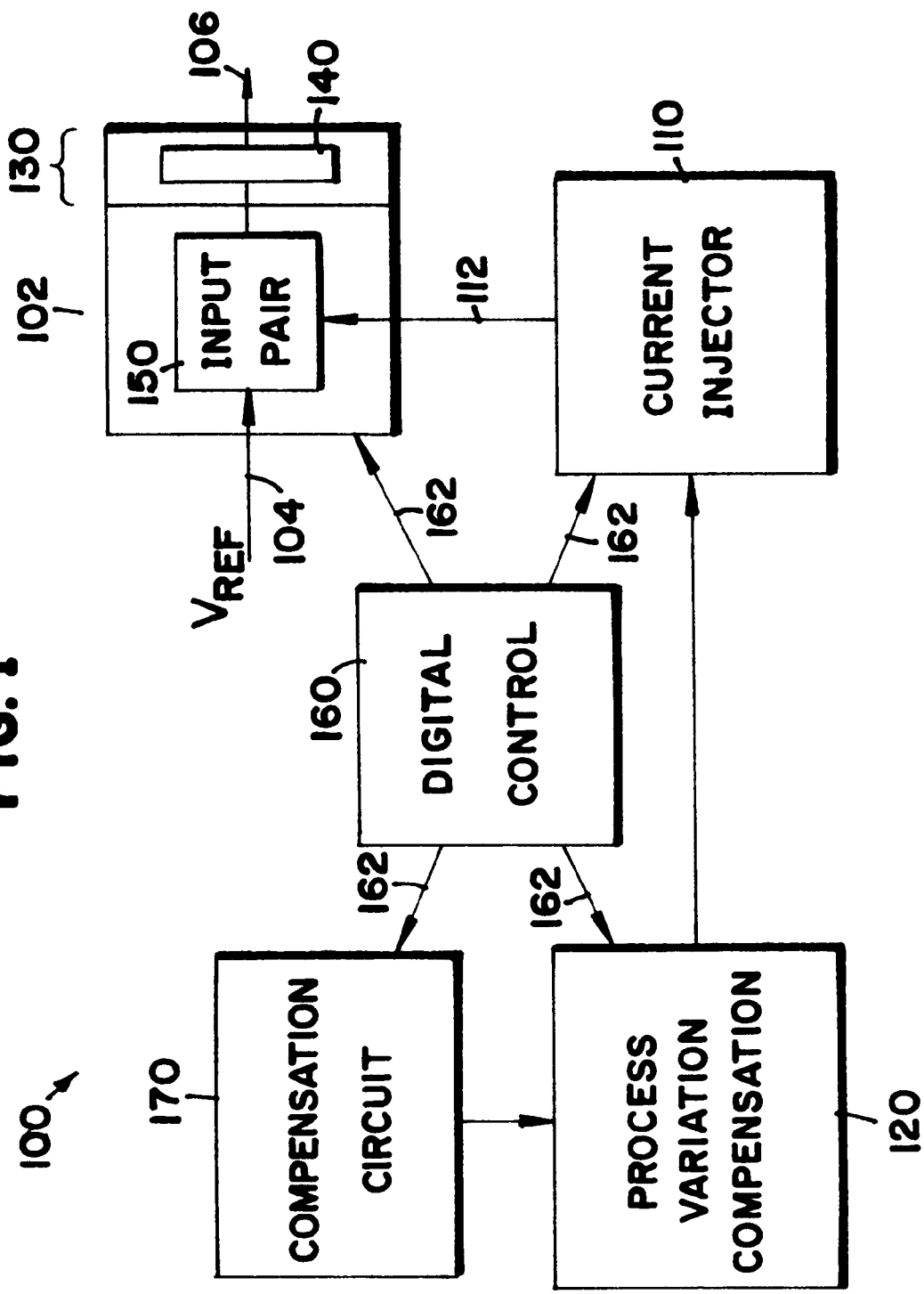
FIG. 1 illustrates a block diagram of an operational amplifier circuit for the line driver according to the present invention.

FIG. 1 shows a block diagram of an operational amplifier circuit 100 for the line driver according to the present invention. The operational amplifier 100 includes a pulse circuit 102 for receiving an input signal 104 and generating an output pulse signal 106 having a rising and falling edge in response to the input signal 104. A selectable current source 110 is coupled to the pulse circuit 102. The selectable current source 110 has a first mode for injecting a large tail current 112 to the pulse circuit 102 to provide a high slew rate for the rising edge of the output pulse signal 106 (i.e., first phase). The selectable current source 110 also includes a second mode wherein a smaller current 112 is injected to the pulse circuit 102 during the generation of the flat top of the output pulse signal 106 (i.e., second phase). Accordingly, the line driver is able to provide a high slew rate during the leading edge of the output pulse.

A tail current selection circuit 120 is provided for controlling the timing and magnitude of the injected current 112. The output pulse signal 106 is generated during a first phase. Accordingly, the pulse circuit 102 transitions to a sleep mode during the second phase thereby providing low power consumption. The pulse circuit 102 includes an output impedance control element 130 for providing a low output impedance for the pulse circuit 102 during a second is phase.

The output impedance control element 130 is designed using a current switch pair 140 for pulling the output 106 to ground level on the falling edge of the output pulse 106 to create a low output impedance. The pulse circuit 102 does not generate an output pulse signal 106 during the second phase. The pulse circuit 102 includes a differential input pair 150 for receiving the input signal 104. A digital control circuit 160 provides control signals 162 to the pulse circuit 102 and the selectable current source 110 for controlling the timing and generation of the output pulse signal. Finally, a processes compensation circuit 170 is provided for reducing dynamic current amplitude variation for the selectable current source 110.

Figure 2:
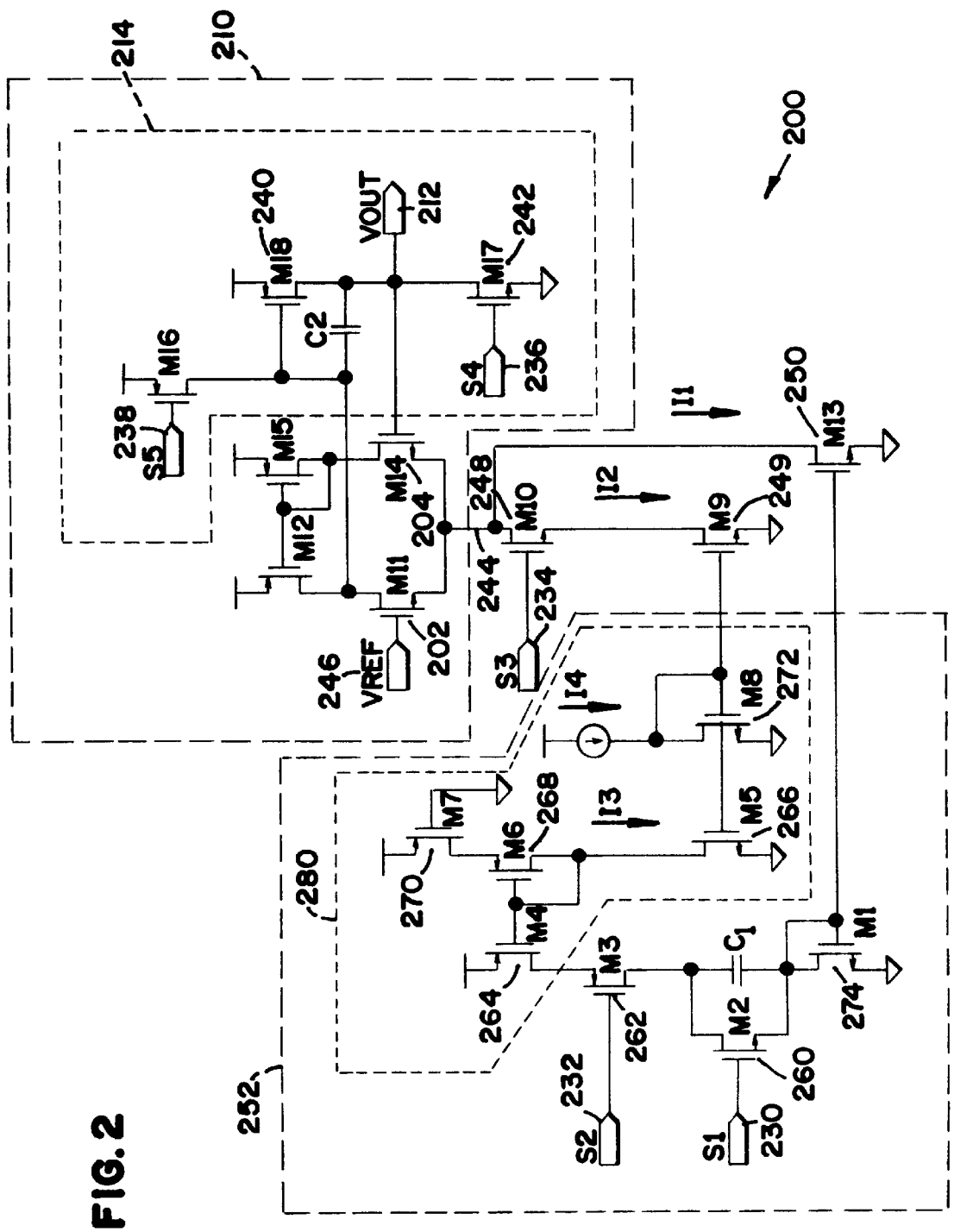
FIG. 2 illustrates a circuit schematic of the operational amplifier.

FIG. 2 illustrates a circuit schematic 200 of the operational amplifier. The operational amplifier includes a differential input pair M11 202, M14 204, forming the input for a unity gain buffer 210. The unity gain buffer 210 drives an output 212 through an output impedance control circuit 214 coupled to the differential input pair M11 202, M14 204. The output impedance control circuit 214 includes transistors M16 220, M18 222 and M17 224. Control signals S1–S5 230–238 are generated by a digital control circuit (not shown). On the falling edge of the output pulse, control signal S5 238 goes low and makes transistor M18 240 turn off. Then control signal S4 236 goes high and turns on M17 242. This pulls the output 212 to ground level very quickly.

In FIG. 2, tail current 244 to the input differential pair 246 is provided through transistors M9 249 and M13 250. The tail current of transistor M9 249 has a control signal S3 234 that turns on and off switch transistor M10 248. The tail current provided by transistor M13 250 is in parallel with the tail current of M10 248. The tail current 244 through the branch including transistor M13 250 is for injecting a large dynamic current to the input differential pair 246 during output of the rising edge. The current of M13 250 is mirrored and controlled by a dynamic bias generating circuit 252. The dynamic bias generating circuit includes capacitor C1 254, and transistors M2 260, M3 262, M4 264, M5 266, M6 268 and M7 270.

Fast rising pulse edges require a large tail current to get high slew rate. But a high slew rate is only required during the generation of the rising edges of the output pulse. Once the output pulse reaches the flat top of the pulse, a large tail current is no longer necessary. So a large dynamic tail current is used to bias the unity gain buffer 210 during pulse rising edges. The large tail current only lasts slightly longer than the rise time of the leading edge of the output pulse and then fades away. The dynamic current may be large to get a very high slew rate, yet the line driver 200 consumes very little power because the large tail current only lasts for a short period of time. The current provided by transistor M10 248 is maintained during the entire mark period to ensure that the circuit 200 fulfills the bandwidth required for high return loss over the flat part of the pulse.

Transistors M4 264, M5 266, M6 268, M7 220 and M8 222 constitute a processes compensation circuit 280 of the dynamic bias generating circuit 252, which greatly reduces the dynamic current amplitude variation over different CMOS process corners. This process variation comes from the transconductance ($g_m$), $G_{ds}$ and parasitic capacitance of MOS devices. If the source of M3 262 is tied to $V_{cc}$ directly, the peak value and time constant of dynamic current going through M1 274 will vary in a wide range due to process variation. The peak value and constant of current is determined by C1 254 and $g_m$ of M1 274. The $g_m$ of M1 274 has a wide variation from different process corners. Device M4 264 forms a current sources to control the dynamic current shooting through C1 254 and M1 274 trying to minimize the process variation impact. When M3 262 is turned on, current will flow until C1 254 becomes charged. Process compensation circuit 280 controls the amplitude of the current flowing through M3 262 and MS 266. The process compensation circuit 280 is implemented using device M7 270 which operates in triode region. It will adjust the gain of current mirror M6 268 and M4 264. Slow processes will have a larger $G_{ds}$ for M7 270 and larger current gain through M4 264. Adjusting the size of M7 270 will get control over the dynamic current variation. Since the pulse overshot on rising edge and ringing is mostly effected by the amount of dynamic current, the control of that current over process variation is important. The dynamic biasing circuit 252 helps to obtain high slew rate during pulse rising edge and reduces driver bandwidth after pulse reaches its flat top. This reduces pulse ringing. If the same value of the dynamic bias current was used as a constant bias current the power consumption and pulse ringing will be larger.

Figure 3:
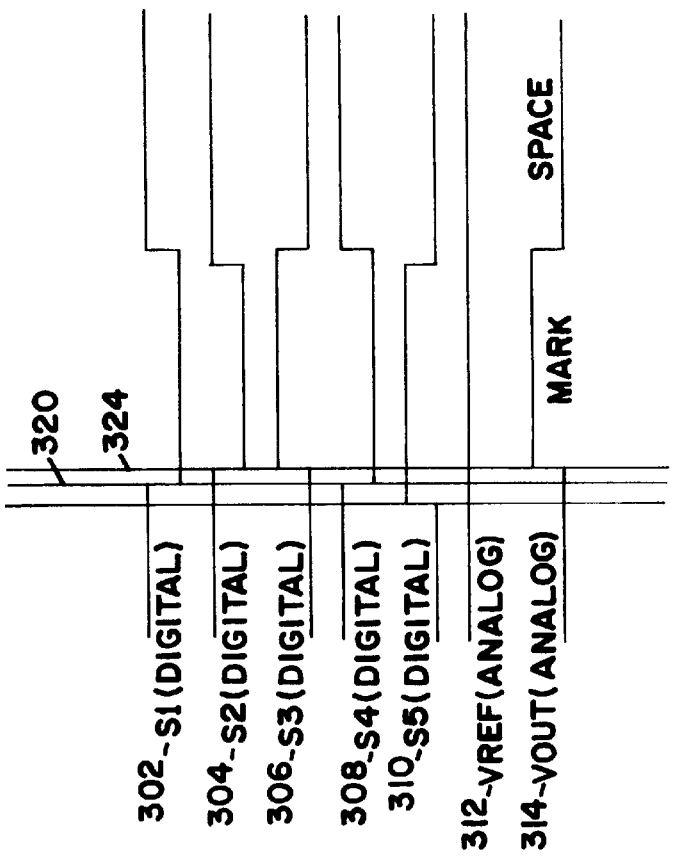
FIG. 3 illustrates a timing diagram for the control signals to the line driver provided by the digital control circuit.

FIG. 3 illustrates a timing diagram 300 for the control signals to the line driver provided by the digital control circuit. The tail current is controlled by control signal S3 306. The other branch of the tail current is controlled by the dynamic bias generating circuit. During space phase, control signal S4 308 is high and turns on the output device M17. At this time, control signal S3 306 is low and turns off device M10 to cut off the tail current running through M9 to save power. Control signal S5 310 is low and turns on M16 which turns off M18. Control signal S1 302 is high and turns on M2. Capacitor C1 is then discharged. Control signal S2 304 is high which turns off M3 to prevent current flowing through transistors M1, M2, and M3. When the mark signal needs to be transmitted, control signal S1 302 goes low 320 before S2 304 goes low 322 to make sure the current charging capacitor C1 will not be bypassed by current flowing through transistor M2. The charge current going through capacitor C1 is large at the beginning since capacitor C1 was discharged previously. This charge current exponentially reduces to zero when Capacitor C1 is fully charged. The current going through M1 is mirrored to M13 to form a supplemental tail current (I1) which is provided to the input differential pair M11 and M14. At same time 324, control signal S3 306 goes high and turns on the base portion of the tail current (I2). Control signal S4 308 goes low 320 after S5 310 goes high to make sure M17 and M18 will not be turned on at same time thereby causing a large rush current.

On the falling edge of output pulse, S5 310 goes low and makes M18 turn off. Then the control signal S4 308 goes high and turns on M17. This pulls the output to ground level very quickly. Meanwhile, control signal S3 306 goes low to shut off the base tail current. Control signal S2 304 goes high to turn off M3. Control signal S1 302 goes high and turns on M2 to discharge C1, thereby preparing for the next mark transmitting cycle.

FIG. 4 illustrates a block diagram of the overall CMOS line driver circuit 400. The driver 400 is a conventional two-stage feedback operational amplifier. The first 402 and second 404 operational amplifiers receive control signals 406 from a first 408 and second 410 digital control circuits. The first digital control circuit 408 receives the PMARK signal 420. The second digital control circuit 410 receives the NMARK signal 422. The PMARK 420 and NMARK 422 signals are converted to control signals S1–S5 406 for each of the two operational amplifiers 402, 404. Reference signal $V_{ref}$ 430 is provided directly to the operational amplifiers 402, 404 and acts as the input to the differential input pair as illustrated in FIG. 2.

The first operational amplifier 402 generates the TTIP signal 440. The second operational amplifier 404 generates the TRING signal 442. The load 450 is coupled to the outputs of the two operational amplifiers 402, 404 via a transformer coupling 460 and through in-series resistors 470, 472.

During space and mark phases, the other side of the driver is always turned on to hold the output at ground level. During the mark phase the output current is flowing to the load 450 and to the output of the other side of the driver which is switched to the low output impedance state as discussed above. At space phase there is no output current flowing through the load 450 because the outputs of both operational amplifiers 402, 404 sit at ground. The two sides of the line driver 402, 404, drive the output pulse alternately through the transformer 460 connected between them.

Figure 5:
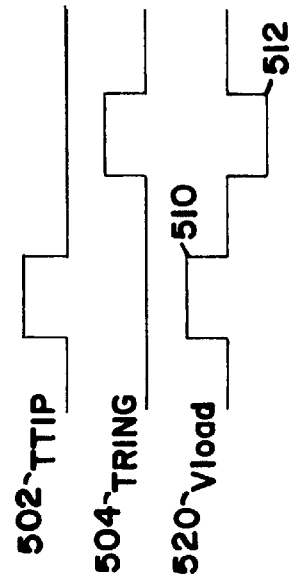
FIG. 5 illustrates a diagram of the output pulse of the first and second operational amplifiers and the output pulse received by the load.

FIG. 5 illustrates a diagram 500 of the output pulse of the first and second operational amplifiers and the output pulse received by the load. The first operational amplifier generates an output pulse which is designated as TTIP 502. The second operational amplifier generates an output pulse which is designated as TRING 504. The two operational amplifiers drive the output pulses through the transformer connected between them. The positive 510 and negative 512 mark signals at the load ($V_{load}$) 520 are obtained on the line via the transformer coupling.

In summary, the present invention provides a low power CMOS line driver that is in sleep mode during space condition and consumes very small power. Constant tail current is supplied only when the line driver is generating the pulse to get a low driver output impedance and a high slew rate at mark condition while saving power in space condition. Dynamic current biasing on the rising edge of the pulse boosts driver speed and reduces power further by reducing constant tail current supplied during the pulse period. Compensated current mirror gain reduces the dynamic current variation over CMOS processes variation. A single ended driver configuration is used to obtain a low driver output impedance and a high return loss during space condition while minimizing power consumption. The result is an improved pulse transient response with less ringing.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. An apparatus for driving a transmission line, comprising:
   a pulse circuit for receiving an input signal and generating an output pulse signal having a rising and falling edge in response to the input signal;
   a selectable current source, coupled to the pulse circuit, the selectable current source having a first mode for injecting a first current to the pulse circuit, the first current providing a high slew rate for the rising edge of the output pulse signal and a second mode for injecting a second current to the pulse circuit during the generation of the output pulse signal, wherein the first current is greater than the second current; and
   a digital control circuit for providing control signals to the pulse circuit and the selectable current source for controlling the timing and generation of the output pulse signal.

2. The apparatus of claim 1 wherein the selectable current source further comprises a first current source, coupled to the pulse circuit, for injecting a base current to the pulse circuit and a second current source for injecting a supplemental current to the pulse circuit, wherein the first current comprises the base current and the supplemental current and the second current comprises the base current.

3. The apparatus of claim 1 further comprising a tail current selection circuit for controlling the timing for the injection of the first current.

4. The apparatus of claim 1 wherein the output pulse signal is generated during a first phase, the pulse circuit further comprising an output impedance control element for providing a low output impedance for the pulse circuit during a second phase.

5. The apparatus of claim 4 wherein the pulse circuit does not generate an output pulse signal during the second phase.

6. The apparatus of claim 4 wherein the pulse circuit further comprises a differential input pair and the output impedance control element comprises a current switch pair coupled thereto, the differential input pair receiving an input signal and driving a load in response thereto during the first phase and the current switch pair pulling the output to ground level on the falling edge of the output pulse to create a low output impedance.

7. The apparatus of claim 4 wherein the pulse circuit comprises a differential input pair for receiving an input signal and driving a load in response thereto during the first phase.

8. The apparatus of claim 4 further comprising a resistor disposed between the output impedance control element and a load to provide high return loss during the second phase.

9. The apparatus of claim 4 wherein the selectable current source injects the second current to the pulse circuit during the first phase.

10. The apparatus of claim 1 wherein the pulse circuit and the selectable current source comprises CMOS transistors.

11. The apparatus of claim 10 further comprising a processes compensation circuit for reducing dynamic current amplitude variation for the CMOS transistors.

12. The apparatus of claim 1 further comprising a processes compensation circuit for reducing dynamic current amplitude variation for the selectable current source.

13. The apparatus of claim 4 wherein the pulse circuit transitions to a sleep mode during the second phase thereby providing low power consumption.

14. An apparatus for driving a transmission line, comprising:
    a first operational amplifier having a first output port and a second operational amplifier having a second output port for generating at the first and second output port an output pulse signal having a rising and falling edge for driving a load on a transmission line in response to an input reference signal, the load being coupled to the first and second output port by a transformer; and
    a first and second digital control circuit, operatively coupled to the first and second operational amplifiers, for providing control signals to the operational amplifiers to control timing of the output pulse signal;
    wherein each of the first and second operational amplifiers further comprise:
       a pulse circuit for receiving the input reference signal and generating the output pulse signal; and
       a selectable current source, coupled to the pulse circuit, the selectable current source having a first mode for injecting a first current to the pulse circuit to provide a high slew rate for the rising edge of the output pulse signal and a second mode for injecting a second current to the pulse circuit during the generation of the output pulse signal, wherein the first current is greater than the second current.

15. The apparatus of claim 14 wherein the selectable current source further comprises a first current source, coupled to the pulse circuit, for injecting a base current to the pulse circuit and a second current source for injecting a supplemental current to the pulse circuit, wherein the first current comprises the base current and the supplemental current and the second current comprises the base current.

16. The apparatus of claim 14 further comprising a tail current selection circuit for controlling the timing for the injection of the first current.

17. The apparatus of claim 14 wherein the output pulse signal is generated during a first phase, the pulse circuit further comprising an output impedance control element for providing a low output impedance for the pulse circuit during a second phase.

18. The apparatus of claim 17 wherein the pulse circuit does not generate an output pulse signal during the second phase.

19. The apparatus of claim 17 wherein the pulse circuit further comprises a differential input pair and the output impedance control element comprises a current switch pair coupled thereto, the differential input pair receiving an input signal and driving a load in response thereto during the first phase and the current switch pair pulling the output to ground level on the falling edge of the output pulse to create a low output impedance.

20. The apparatus of claim 17 wherein the pulse circuit comprises a differential input pair for receiving an input signal and driving a load in response thereto during the first phase.

21. The apparatus of claim 17 further comprising a resistor disposed between the output impedance control element and a load to provide high return loss during the second phase.

22. The apparatus of claim 14 further comprising a digital control circuit for providing control signals to the pulse circuit and the selectable current source for controlling the timing and generation of the output pulse signal.

23. The apparatus of claim 17 wherein the selectable current source injects the second current to the pulse circuit during the first phase.

24. The apparatus of claim 14 wherein the pulse circuit and the selectable current source comprises CMOS transistors.

25. The apparatus of claim 24 further comprising a processes compensation circuit for reducing dynamic current amplitude variation for the CMOS transistors.

26. The apparatus of claim 14 further comprising a processes compensation circuit for reducing dynamic current amplitude variation for the selectable current source.

27. The apparatus of claim 17 wherein the pulse circuit transitions to a sleep mode during the second phase thereby providing low power consumption.

28. A method for driving a transmission line, comprising:
receiving an input signal;
generating an output pulse signal having a rising and falling edge in response to the input signal;
injecting a first current to the pulse circuit during the step of generating the rising edge of the output pulse signal to provide a high slew rate for the rising edge of the output pulse signal;
injecting a second current to the pulse circuit during the generation of the output pulse signal; and
providing processes compensation to reduce dynamic current amplitude variation during the steps of injecting the first and second currents.

29. The method of claim 28 further comprising the step of controlling the timing for the injection of the first and second currents.

30. The method of claim 28 wherein the step of generating the output pulse signal comprises the step of generating the output pulse signal during a first phase.

31. The method of claim 30 further comprising the step of providing a low output impedance for the pulse circuit during a second phase.

32. The method of claim 31 further comprises the step of providing a near zero voltage level output during the second phase.

33. The method of claim 32 wherein the step of providing a near zero level output further comprises the step of pulling the output to near zero voltage level on the falling edge of the output pulse to create a low output impedance.

34. The method of claim 30 further comprising the step of providing a high return loss during the second phase.

35. The method of claim 28 further comprising the step of controlling the timing and generation of the output pulse signal.

* * * * *